United States Patent [19]

Yamauchi

[11] Patent Number: 5,151,765
[45] Date of Patent: Sep. 29, 1992

[54] SEMICONDUCTOR DEVICE COMPRISING HIGH-SPEED AND HIGH-CURRENT TRANSISTORS FORMED IN A COMMON SUBSTRATE AND HAVING MATCHED CHARACTERISTICS

[75] Inventor: Tunenori Yamauchi, Kawasaki, Japan
[73] Assignee: Fujitsu Limited, Kawasaki, Japan
[21] Appl. No.: 685,153
[22] Filed: Apr. 10, 1991

Related U.S. Application Data

[63] Continuation of Ser. No. 354,839, May 22, 1989, abandoned.

[30] Foreign Application Priority Data

May 20, 1988 [JP] Japan .................. 63-124117

[51] Int. Cl.$^5$ .................. H01L 29/72; H01L 27/02
[52] U.S. Cl. ............................... 357/34; 357/43; 357/42
[58] Field of Search ............... 357/34, 22, 51, 52, 357/59, 84, 35, 41, 42, 43, 59 E, 59 H

[56] References Cited

U.S. PATENT DOCUMENTS

| | | | |
|---|---|---|---|
| 4,418,469 | 12/1983 | Fujita | 357/34 X |
| 4,826,780 | 5/1989 | Takemoto | 357/34 |
| 4,879,584 | 11/1989 | Takagi et al. | 357/43 |
| 4,957,874 | 9/1990 | Soejima | 357/34 |

FOREIGN PATENT DOCUMENTS

| | | |
|---|---|---|
| 0108204 | 5/1984 | European Pat. Off. . |
| 49-114882 | 11/1974 | Japan . |
| 0113269 | 9/1979 | Japan .................. 357/22 |
| 57-106160 | 7/1982 | Japan . |
| 59-182571 | 10/1984 | Japan .................. 357/23.14 |
| 60-88455 | 5/1985 | Japan . |
| 61-67271 | 4/1986 | Japan . |

OTHER PUBLICATIONS

"A High-Speed Bipolar LSI Process Using Self-Aligned Doubled Diffusion Polysilicon Technology", Kikuchi et al, IEEE IEDM-86, 1986, pp. 420-423.
IBM Technical Disclosure Bulletin, vol. 15 #2, Jul. 1972.
M. Nakamae: "Recent Process and Future Prospe for VLSI . . . ", IEEE BCIM, 1987, pp. 5-6.
T. C. Chen, et al: "Reliability Analysis of Self-Aligned Bipolar . .. ", IEEE IEDM, 1986, pp. 650-653.

Primary Examiner—Rolf Hille
Assistant Examiner—Mahshid Saadat
Attorney, Agent, or Firm—Staas & Halsey

[57] ABSTRACT

A semiconductor device having a submicron miniaturization level structure comprises a first high-current bipolar transistor having a first wide emitter width and a second high-speed bipolar transistor having a narrow emitter width relatively to the first emitter width, which transistors are formed in a second common semiconductor substrate. According to a first embodiment, the base region of the first transistor is thicker than that of the second transistor, and thus a suitable $h_{Fe}$ balance is maintained; and according to another embodiment, the first, base region of the first transistor has a higher impurity concentration than the second base region of the second transistor and has the same depth as that of the second base region, so that a suitable $h_{FE}$ balance is maintained.

12 Claims, 4 Drawing Sheets

SEMICONDUCTOR DEVICE COMPRISING HIGH-SPEED AND HIGH-CURRENT TRANSISTORS FORMED IN A COMMON SUBSTRATE AND HAVING MATCHED CHARACTERISTICS

This application is a continuation of application Ser. No. 07/354,839, filed May 22, 1989, now abandoned.

BACKGROUND OF THE INVENTION

1. Field of the Invention

The present invention relates to a semiconductor device such as an IC, LSI, and VLSI, comprising a high-speed transistor and a high-current (or output) transistor formed in a common substrate.

The subject type of semiconductor device generally comprises high-speed bipolar transistors (or field-effect transistors: FETs) for an arithmetic unit, a logic circuit, memory elements, and the like, and high-current bipolar transistors (or FET's) for an output circuit. Namely, the high-speed transistors operate at a small current and have a low breakdown voltage, but the high-current transistors operate at a large current and at a slower speed than that of the high-speed transistor, and have a high breakdown voltage.

2. Description of the Related Art

In the semiconductor device comprising the high-speed bipolar transistor and the high-current bipolar transistor, a suitable balance of the static common-emitter current gains $h_{FE}$ of the respective transistors should be maintained, to ensure a stable operation and enable a simple circuit design for the device. A suitable $h_{FE}$ balance is that where the $h_{FE}$ of the high-current bipolar transistor is within ±30% of that of the high-speed bipolar transistor.

In the prior art, both bipolar transistors have the same emitter width of several micrometers (i.e., more than 1 $\mu$m) in view of the $h_{FE}$ balance.

Recently, to increase the switching (operating) speed of the high-speed bipolar transistor, shallow junction type bipolar transistors have been proposed (e.g., K. Kikuchi et al: "A High-Speed Bipolar LSI Process Using Self-Aligned Double Diffusion Polysilicon Technology", IEEE IEDM, 1986, pp. 420-423; M. Nakamae; "Recent Progress and Future Prospe for VLSI Si Bipolar Transistors", IEEE BCIM, 1987, pp. 5-6). The shallow junction structure is formed by a thermal diffusion of impurities into a silicon substrate (particularly, a silicon epitaxial layer corresponding to a collector region) from a polycrystalline silicon layer doped with the impurities by an ion-implantation process. Preferably, the emitter width is made narrower (less than 1 $\mu$m) for a higher operation speed, shallower shallow junction, lower power consumption, and in view of device miniaturization. The high-speed bipolar transistor can operate at 0.1 mA. Since the high-current bipolar transistor can operate at a large current (e.g., 24 to 30 mA), the emitter width should be wider than that of the high-speed bipolar transistor, but a simultaneous fabrication of the bipolar transistor with a narrow emitter width (FIG. 1B) and the bipolar transistor with a wide emitter width (FIG. 1A) leads to an $h_{FE}$ unbalance. As shown in FIGS. 1A and 1B, base regions 51a and 51b having the same depth are simultaneously formed in collector regions 52a and 52b, which are portions of an epitaxial Si layer on an Si substrate (not shown). A wide emitter window 53a having an emitter width X of, e.g., 1.5 $\mu$m, and a narrow emitter window 54b having an emitter width Y of, e.g., 0.5 $\mu$m, are opened in an insulating (SiO$_2$) layer 54 covering the epitaxial layer, and when a polycrystalline silicon layer 55 having a thickness of, e.g., 100 nm, is deposited over the whole surface by a chemical vapor deposition (CVD) process, a portion 55b of the layer 55 filling the window 53b is thicker than a portion 55a filling the window 53a. The polycrystalline silicon layer 55 is then doped with impurities by an ion-implantation process at the projected range $R_p$ of, e.g., 50 nm. To diffuse the doped impurities into the base regions 51a and 51b, the device is subjected to a heat-treatment at 950° C. for 30 minutes, so that emitter regions 56a and 56b are formed in the base region 51a and 52b, respectively. The emitter region 56a has a depth of, e.g., 150 nm, and the emitter region 56b has a depth of, e.g., 100 nm. The emitter region 56b is shallower (thinner) than the emitter region 56a, because the filling portion 55b includes an undoped portion thicker than that included in the filling portion 55a, and as a result, the active base region thickness Za of the wide emitter 53a is smaller than the Zb of the narrow emitter 53b. In general, the $h_{FE}$ is in inverse proportion to the amount of impurities in the active base region, and therefore, as the thickness of the active base becomes thinner (i.e., the thickness reduces), the $h_{FE}$ becomes larger and is not suitably balanced.

To control the $h_{FE}$ of the high-current bipolar transistor, a multi-emitter structure which accordingly increases the number of the emitter regions, or the elongation of an emitter length, may be adopted, but this leads to an enlargement of the transistor size, which does not allow the desired miniaturization of the device and prevents an increase of the degree of integration.

SUMMARY OF THE INVENTION

An object of the present invention is to provide a semiconductor device comprising shallow junction type bipolar transistors, the emitter regions of which have $h_{FE}$ balance.

Another object of the present invention is to provide a semiconductor device comprising a high-speed transistor and a high-current transistor, the device miniaturization and integration degree of which are improved.

A further object of the present invention is to provide a semiconductor device comprising a shallow junction type bipolar transistor and a junction field-effect transistor (JFET) having an impurity-containing layer serving as an impurity diffusion source for a gate region.

Still another object of the present invention is to provide a semiconductor device comprising a high-speed JFET and a high-current JFET, the gate regions of which are formed by a thermal diffusion of impurities from an impurity-containing layer on both transistors.

The above-mentioned and other objects of the present invention are realized by providing a semiconductor device comprising a first (high-current) transistor having a wide emitter width and a second (high-speed) transistor having a narrow emitter width, both transistors being formed in a common semiconductor substrate, and according to a first embodiment of the present invention, a first base region of the first transistor being thicker than a second base region of the second transistor, so that a suitable $h_{FE}$ balance is maintained.

According to the first embodiment, taking into consideration that a first emitter region of the first transistor with the wide emitter width is deeper than a second emitter region of the second transistor with the narrow emitter width, due to a shallow junction formation process, the first base region is made deeper than the second base region by controlling the ion-implantation energy, with the result that a first active base region thickness under the first emitter region is similar or equal to a second active base region under the second emitter region. Preferably, the wide emitter width is from 0.4 to 4.0 μm (in particular, 0.45 to 1.0 μm) and the narrow emitter width is from 0.1 to 0.75 μm (in particular, 0.2 to 0.4 μm).

The above-mentioned and other objects of the present invention are also realized by the semiconductor device according to a second embodiment of the present invention, wherein a first base region of the first transistor has a higher impurity concentration than that of a second base region of the second transistor and has the same depth as that of the second base region, so that a suitable $h_{FE}$ balance is maintained. Preferably, the impurity concentration of the first base region corresponds to a dose of from 3 to 10 (in particular, 4 to 7) $\times 10^{13}$ cm$^{-2}$ and that of the second base region corresponds to a dose of from 1 to 8 (in particular, 3 to 6)$\times 10^{13}$cm$^{-2}$.

In this case, since the first active base region has a thickness smaller than, and an impurity concentration higher than, those of the second active base region, the impurity amount of the first active base region is similar or equal to that of the second active base region.

The base region thickness control and the base region impurity concentration control according to the present invention can be applied to a channel region (or channel regions) of a JFET (or JFETs) included in a semiconductor device comprising a first (high-current) transistor and a second (high-speed) transistor.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1A:
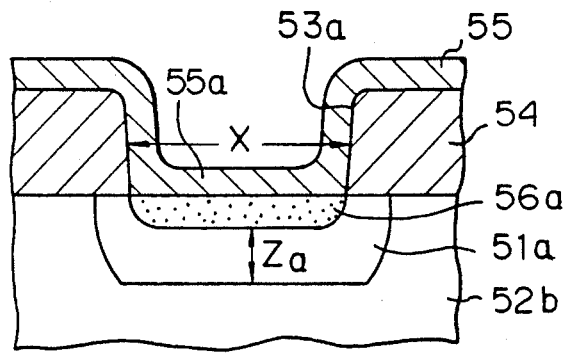
FIG. 1A is a schematic cross-sectional view of a bipolar transistor having a wide emitter width.
Figure 1B:
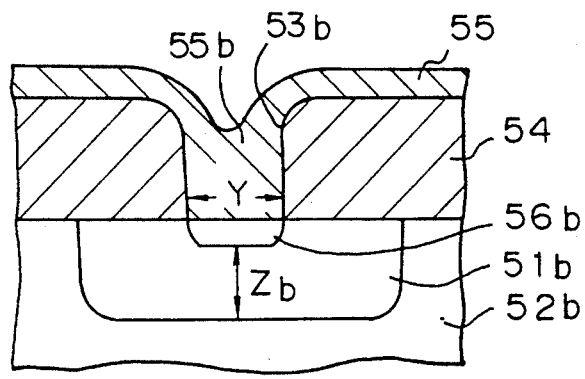
FIG. 1B is a schematic cross-sectional view of another bipolar transistor having a narrow emitter width.
Figure 2:
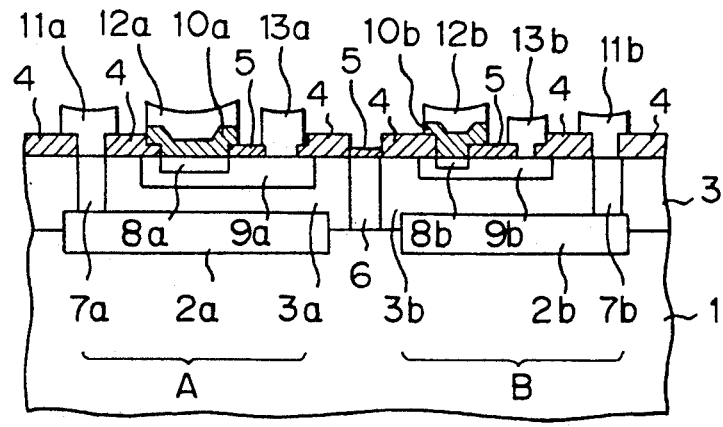
FIG. 2 is a schematic cross-sectional view of a semiconductor device according to a first embodiment of the present invention.

Referring to FIG. 2, a semiconductor device comprising a high-current (output) bipolar transistor A and a high-speed bipolar transistor B according to a first embodiment of the present invention is now explained.

For example, both of the npn-type transistors A and B are formed in a common semiconductor substrate consisting of a p-type semiconductor (Si) substrate (wafer) 1 and an n-type semiconductor (epitaxial Si) layer 3 having a resistivity of 0.5 Ωcm and a thickness of 1.6 μm, and n$^+$-type buried layers 2a and 2b having a resistivity of 20 Ω/ and a thickness of 3 μm are separately formed between the substrate 1 and the epitaxial layer 3. The epitaxial layer 3 is covered with a relatively thick insulating layer (field SiO$_2$ layer) 4 having a thickness of 600 nm and a thin insulating layer 5 having a thickness of 50 nm, and is divided into collector regions 3a and 3b by an isolation region 6 composed of a p$^+$-type impurity doped region (or insulator). The collector contact (n$^+$-type) regions 7a and 7b extend from the surface of the collector regions 3a and 3b to the buried layers 2a and 2b, respectively. Then p$^+$-type base regions 9a and 9b are formed in the collector regions 3a and 3b, respectively, and N+-type emitter regions 8a and 8b are formed in the base regions 9a and 9b, and covered with impurity-containing layers 10a and 10b of, e.g., polycrystalline silicon, containing donor impurities and having a thickness of 100 nm. Electrodes (collector electrodes 11a, 11b, emitter electrodes 12a, 12b and base electrodes 13a, 13b) are formed on the collector contact regions 7a, 7b, the impurity-containing layers 10a, 10b and the base regions 9a, 9b, respectively, and accordingly, the high-current bipolar transistor A is composed of the collector region 3a, base region 9a, emitter region 8a, and electrodes 11a, 12a and 13a, and the high-speed bipolar transistor B is composed of the collector region 3b, base region 9b, emitter region 8b, and electrodes 11b, 12b and 13b.

According to the present invention, for example, the base region 9a has a depth of from 0.45 to 0.55 μm and the base region 9b has a depth of from 0.3 to 0.4 μm, and thus is shallower than the region 9a. The high-current transistor A has a wide emitter width of 2.0 μm, and accordingly, the emitter region 8a has a depth of 0.25 μm, and the high-speed transistor B has a narrow emitter width on the order of submicrons (0.6 μm), and thus the emitter region 8b has a depth of 0.15 μm, which is less than that of the region 8a. As a result of the depth control of the regions 9a, 9b, 8a and 8b the thickness of the respective active base regions of transistors A and B are substantially the same and, since the respective base regions 9a and 9b have substantially the same impurity concentrations, they contain substantially the same impurity amounts and thus, the static common-emitter current gains $h_{FE}$ of both transistors A and B are roughly equivalent (e.g., an $h_{FE}$ difference between the high-current transistor A and high-speed transistor B can be kept to within +30% of the $h_{FE}$ of the high-speed transistor B). Therefore, while maintaining the $h_{FE}$ balance between the high-current transistor A and high-speed transistor B, the emitter width of the high-current transistor A can be suitably expanded, so that the transistor A operates at an operating current of, e.g., 30 mA. In this case, the high-current power transistor A occupies about half (50%) of the space required by a conventional power transistor having a multi-emitter structure, and this reduction of size of the high-current bipolar transistors contributes to the miniaturization of, and an increase of the integration degree of, an IC device.

Figure 3A:
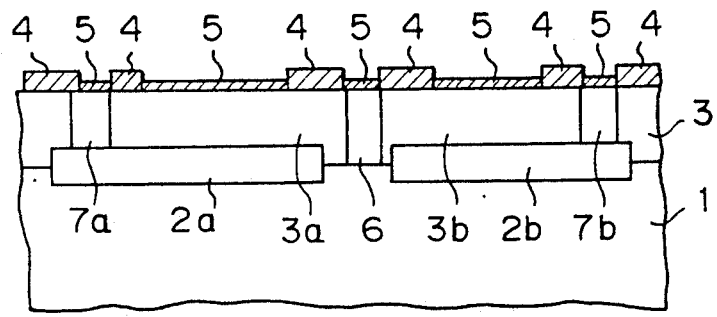
FIGS. 3A to 3C are schematic cross-sectional views of the semiconductor device of FIG. 2 in various stages of production.
Figure 3B:
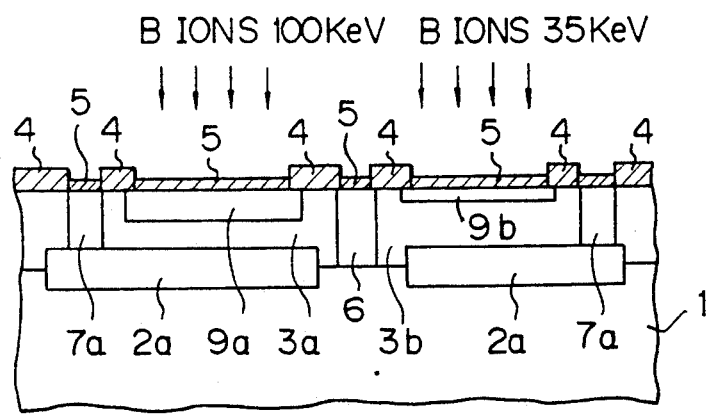
Figure 3C:
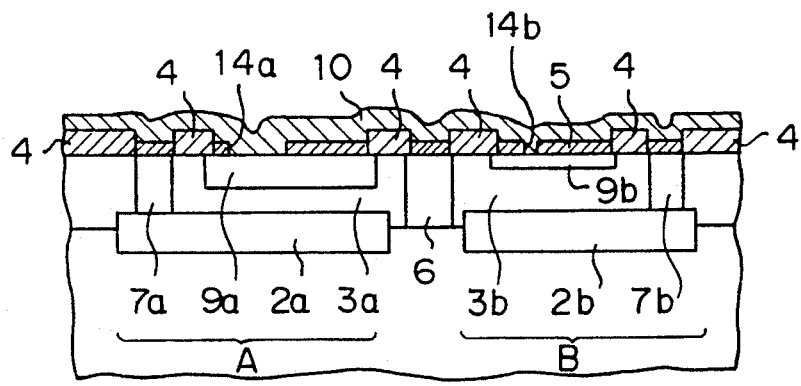

The semiconductor device shown in FIG. 2 is produced as follows and as shown in FIGS. 3A to 3C.

As shown in FIG. 3A, using a conventional process for producing an npn-type bipolar transistor, donor impurities (e.g., Sb) are introduced into the Si substrate 1 by an ion-implantation process, and the n-type Si layer 3 having a thickness of 600 nm is epitaxially grown on the Si substrate 1 to form the n+-type buried layers 2a and 2b having a thickness of 3 μm and a resistivity of 20 Ω/□. The Si epitaxial layer 3 is thermally and selectively oxidized to form the field SiO2 layer 4 having a thickness of 600 nm, by the LOCOS process, donor impurities are selectively introduced into the Si epitaxial layer 3 and acceptor impurities are selectively introduced into the layer 3, and then the Si epitaxial layer 3 is thermally oxidized so that a thin SiO2 layer 5 having a thickness of 50 nm is formed, and simultaneously, an annealing is carried out to form the collector regions 7a and 7b reaching the buried layers 2a and 2b and the p+-type isolation region 6 reaching the Si substrate 1, to divide the Si epitaxial layer into the collector regions 3a and 3b.

As shown in FIG. 3B, for the power bipolar transistor, for example, acceptor impurities (e.g., boron ions) are introduced into the collector region 3a through the SiO2 layer 5 by an ion-implantation process at an energy of 100 keV and a dose of $5 \times 10^{13}$ cm$^{-2}$. For the high-speed bipolar transistor, the same acceptor impurities (boron ions) are introduced into the collector region 3b through the SiO2 layer 5 by an ion-implantation process at an energy of 35 keV and a dose of $5 \times 10^{13}$ cm$^{-2}$. Therefore, although the doses are the same, the implantation energies are different. Thereafter, an annealing (heat-treatment) after ion-implantation is carried out at 900° C. for 30 minutes, so that the base region 9a having a depth of from 0.45 to 0.5 μm and the base region 9b having a depth of from 0.3 to 0.4 μm are formed in the collector regions 3a and 3b, respectively. Therefore, the base region 9a is thicker than the base region 9b.

Figure 4A:
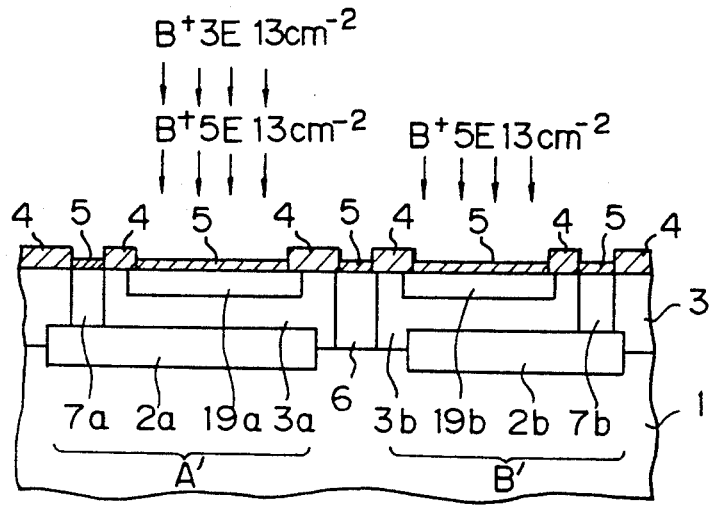
FIGS. 4A to 4C are schematic cross-sectional views of a semiconductor device according to a second embodiment of the present invention, in various stages of production.
Figure 4B:
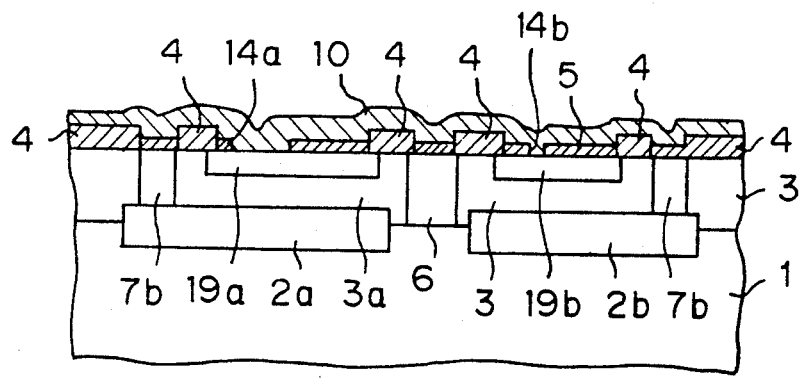
Figure 4C:
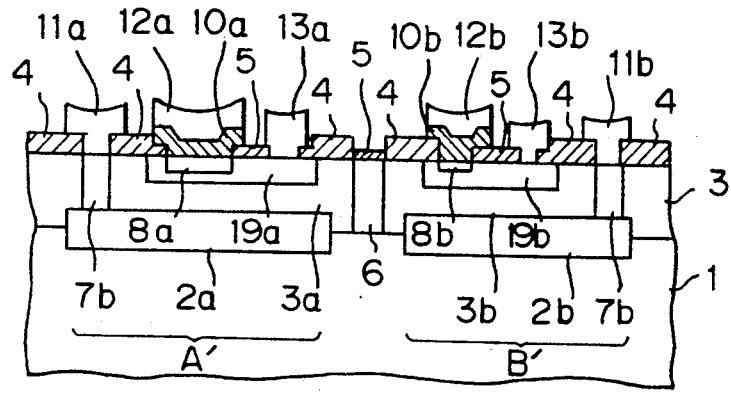

As shown in FIG. 3C, the insulating layer (SiO2 layer) 5 is selectively etched by a conventional lithographic and etching process to form emitter windows 14a and 4b in which the base regions 9a and 9b are exposed, respectively. The emitter window 14a has a width of 2.0 μm and the emitter window 14b for the high-speed transistor has a width of 0.6 μm. Before the lithographic process, a SiO2 layer (not shown) may be additionally deposited over the whole surface by a CVD process. Preferably a reactive ion etching process is used as the etching process. Then a polycrystalline silicon layer having a thickness of 100 nm is deposited over the whole surface by a CVD process, so that the windows 14a and 14b are completely filled therewith, and donor impurities (e.g., arsenic ions) are introduced into the polycrystalline Si layer only by an ion-implantation process at an energy of 60 keV and a dose of $5 \times 10^{15}$ cm$^{-2}$, to form the impurity-containing layer 10. To diffuse the impurities from the layer 10 into the base regions 9a and 9b, the device is subjected to a heat-treatment at 950° C. for 30 minutes, and as a result, as shown in FIG. 2, the emitter regions 8a and 8b are formed to depths of 0.25 μm and 0.15 m, respectively. Then the impurity-containing layer 10 is selectively etched by a conventional process to leave the portions 10a and 10b of the layer 10 on the emitter regions 8a and 8b, and the thin SiO2 layer 5 is selectively etched to form contact windows for the collector contact regions 7a and 7b and the base regions 3a and 3b. A conductor layer is then deposited over the whole surface and is patterned (selectively etched) to form the electrodes 11a, 11b, 12a, 12b, 13a and 13b, whereby the semiconductor device shown in FIG. 2 is obtained. Referring to FIGS. 4A to 4C, a semiconductor device comprising a high-current bipolar transistor A' and a high-speed bipolar transistor B, according to a second embodiment of the present invention is now explained. Where the reference numerals used in FIGS. 2 and 3A to C are used in FIGS. 4A to 4C, these reference numerals indicate the same portions as, or portions corresponding to, those used in FIGS. 2 and 3A to 3C. For example, both of the npn-type transistor A' and B, are formed in a common semiconductor substrate consisting of a p-type semiconductor Si wafer substrate 1 and n-type epitaxial Si layer 3. The n+-type buried layers 2a, 2b, the collector regions 3a and 3b, the n+-type collector contact regions 7a, 7b, the emitter regions 8a, 8b, the isolation region 6, the thick insulating (SiO2) layer 4, the thin insulating (SiO2) layer 5, the impurity-containing layer portions 10a, 10b, and the electrodes 11a, 11b, 12a, 12b, 13a, 13b are the same as those of the semiconductor device shown in FIG. 2. According to the present invention, for example, a p+-type base region 19a of the high-current transistor A' and a p+-type base region 19b of the high-speed transistor B, have the same depth of 0.15 μm, but the former region 19a has an impurity concentration (a dose of $8 \times 10^{13}$ cm$^{-2}$) higher than that (a dose of $5 \times 10^{13}$ cm$^{-2}$) of the latter, region 19b.

Since the base region 19a has the same depth as that of the base region 19b, the distance between the emitter-base junction face and the base-collector junction face (i.e., the active base region thickness under the emitter region 8a) of the transistor A' is smaller than the distance between the emitter-base junction face and the base-collector junction face (i.e., the active base) region thickness under the emitter region 8b of the transistor b'. As mentioned above, the impurity concentration of the base region 19a is higher than that of the base region 19b. The impurity amount is the active base region of the high-current transistor A', accordingly, can be almost the same as, i.e., equivalent to, the impurity amount in the active base region of the high-speed transistor B'. As a result of the impurity concentration control of the base regions 19a and 19b and the depth control of the emitter regions 8a and 8b, the static common-emitter current gains h$_{FE}$ of the transistors A' and B' can be made roughly equivalent, as obtained in the device shown in FIG. 2 of the first embodiment. Therefore, the device shown in FIG. 4C has the same advantages as those of the device of the first embodiment.

The semiconductor device (shown in FIG. 4C) of the second embodiment of the present invention is produced as follows and as shown in FIG. 3A and FIGS. 4A to 4C.

In accordance with a conventional npn-type bipolar transistor, as shown in FIG. 3A, the npn-type buried layers 2a, 2b, the n-type epitaxial Si layer 3 including the collector regions 3a, 3b, the thick SiO2 layer 4, the thin SiO2 layer 5, the p+-type isolation region 6, and the n+-type collector contact region are formed as explained in the first embodiment. The buried layers 2a and 2b have a thickness of 3 μm and a resistivity of 20 Ω/□, and the epitaxial Si layer has a thickness of 600 nm.

Then, as shown in FIG. 4A, for example, acceptor impurities (e.g., boron ions) are introduced into the collector regions 3a and 3b through the thin SiO2 layer layer 5 by a first ion-implantation process at an energy of 35 keV and a dose of $5 \times 10^{13}$ cm$^{-2}$. Using a second ion-implantation process, the same acceptor impurities are then introduced into the collector region 3a only of the power transistor A' at the same energy (35 keV) and a dose of $3 \times 10^{13}$ cm$^{-2}$. Accordingly, the p$^+$-type base regions 19a and 19b are formed and the former region 19a has an impurity concentration higher than that of the latter region 19b, but has the same depth as the latter region 19b. It is possible to form the base region 19a with boron ions at a dose of $8 \times 10^{13}$ cm$^{-2}$ and to form the base region 19b with boron ions at a dose of $5 \times 10^{13}$ cm$^{-2}$, by respective ion-implantation processes at a constant energy of 35 keV.

As shown in FIG. 4B, the thin SiO$_2$ layer 5 is selectively etched by a conventional lithographic and etching process to form emitter windows 14a and 14b, to expose portions of the base regions 19a and 19b, in a manner similar to that explained in the first embodiment. Then a polycrystalline silicon layer having a thickness of 100 nm is deposited over the whole surface by a CVD process, to fill the windows 14a and 14b, and donor impurities (e.g., arsenic ions) are introduced into the polycrystalline silicon layer 10, only by an ion-implantation process at an energy of 60 keV, and a dose of $5 \times 10^{15}$ cm$^{-2}$, to form the impurity-containing layer 10.

Next, as shown in FIG. 4C, the device with the arsenic-containing layer 10 is subjected to a heat-treatment at 950° C. for 30 minutes, to form the emitter regions 8a and 8b in the base regions 19a and 19b, respectively. The emitter region 8a has a depth of 0.25 μm and the emitter region 8b has a depth of 0.15 μm. The impurity-containing layer 10 is selectively etched to leave the portions 10a and 10b on the emitter regions 8a and 8b, and the thin SiO$_2$ layer 5 is selectively etched to form contact windows for the electrodes. A conductor layer is deposited over the whole surface and is patterned to form the emitter electrodes 11a, 11b, emitter electrodes 12a, 12b, and base electrodes 13a, 13b, and thus the semiconductor device is obtained.

As mentioned above, although the emitter width of the high-current bipolar transistor is different from that of the high-speed bipolar transistor, the h$_{FE}$ values of both transistors are kept at a similar or approximately the same level, and the high-current bipolar transistor size is reduced.

Figure 5:
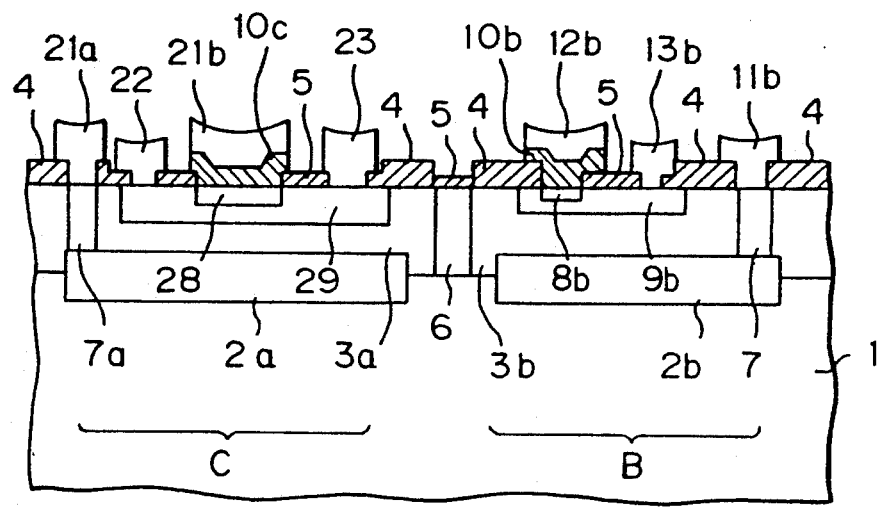
FIG. 5 is a schematic sectional view of a semiconductor device comprising a JFET and a bipolar transistor according to a third embodiment of the present invention; and, FIG. 6 is a schematic sectional view of a semiconductor device comprising JFETs according to a fourth embodiment of the present invention.

Referring to FIG. 5, according to a third embodiment of the present invention, a semiconductor device comprising a shallow junction type bipolar transistor (e.g., a high-speed bipolar transistor B the same as that shown in FIG. 2) and a junction field-effect transistor (JFET) C which serves as a high-current JFET and has a gate region formed by diffusing impurities from an impurity-containing layer. Where the reference numerals used in FIG. 2 are used also in FIG. 5, the reference numerals indicate the same portions or portions corresponding to those used in FIG. 2. The p-channel JFET C comprises a p-type channel region 29, an n$^+$-type top gate region 28, an n-type bottom gate region consisting of an n-type epitaxial layer region 3a, an n$^+$-type buried layer 2a and an n$^+$-type contact region 7a, and electrodes (a bottom gate electrode 21a, a top gate electrode 21b on an impurity-containing layer portion 10a, a sorce electrode 22 and a drain electrode 23). The gate electrodes 21a and 21b are electrically connected to each other, and the source and drain electrodes 22 and 23 are brought into contact with the channel region 29 and are arranged on respective opposite sides of the top gate electrode 21b. The channel region 29 is formed by an ion-implantation process at an energy of 160 keV and a dose of $5 \times 10^{12}$ cm$^{-2}$ of boron ions. The top gate region 28 corresponds to the wide emitter region 8a and is formed by a thermal diffusion of donor impurities (arsenic) from the impurity-containing layer portion 10a, as explained in the first embodiment, and thus the top gate region 28 has a depth of 0.25 μm.

It is possible to adopt the high-current bipolar transistor A (FIG. 2) and a high-speed JFET D (FIG. 6, hereinafter explained) instead of the high-current JFET C and the high-speed bipolar transistor B, respectively, of FIG. 5.

A semiconductor device comprising a JFET and a bipolar transistor has been proposed in, e.g., Japanese Unexamined Patent Publication (Kokai) No. 49-114882. In this case, an emitter region has a depth of 2.0 μm, an active base region has a thickness of about 0.9 μm, a top gate region has a depth of about 2.4 μm, and an active channel region has a thickness of about 0.6 μm. Accordingly, the bipolar transistor is not a shallow junction type and the semiconductor device does not reach a submicron miniaturization level.

Figure 6:
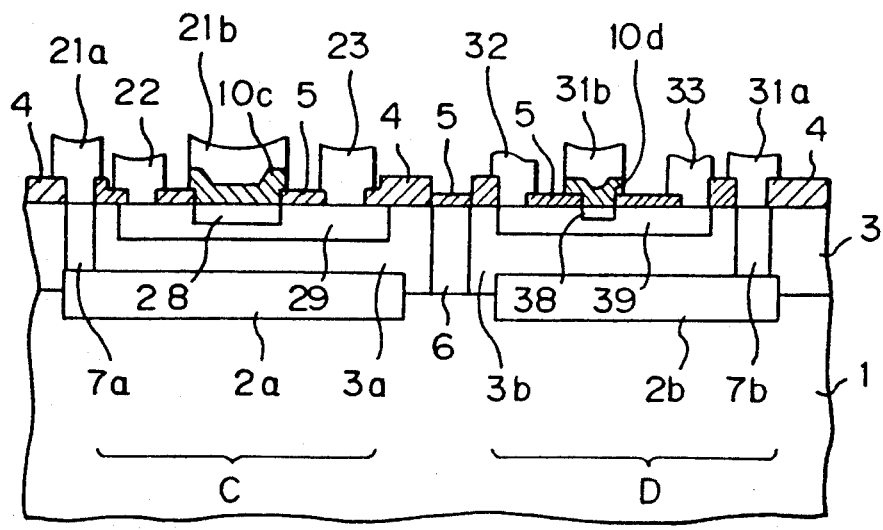

Referring to FIG. 6, according to a fourth embodiment of the present invention, a semiconductor device comprises the high-current JFET C (the same as that shown in FIG. 5) and the high-speed JFET D. Where the same reference numerals used in FIGS. 2 and 5 are used in FIG. 6, those reference numerals indicate the same portions or the portions corresponding to those used in FIG. 2 and 5. The high-speed JFET D comprises a p-type channel region 39, an n$^+$-type top gate region 38, an n-type bottom gate region consisting of an n-type epitaxial layer region 3b, an n$^+$-type buried layer 2b, and an n$^+$-type contact region 7b, and electrodes (a bottom gate electrode 31a, a top gate electrode 31b on an impurity-containing portion 10b, a source electrode 32 and a drain electrode 33). The gate electrodes 31a and 31b are electrically connected, and the source and drain electrodes 32 and 33 come into contact with the channel region 39 and are arranged on opposite sides of the top gate electrode 31b. The channel region 39 is formed by an ion-implantation process at an energy of 160 keV and a dose of $\times 10^{12}$ cm$^{-2}$ of boron ions. The top gate region 39 corresponds to the narrow emitter region 8b and is formed by thermal diffusion of donor impurities (arsenic) from the impurity-containing layer portion 10b, as explained in the first embodiment, and thus the top gate region 39 has a depth of 0.15 μm.

It will be obvious that the present invention is not restricted to the above-mentioned embodiments and that many variations are possible for persons skilled in the art without departing from the scope of the invention. For example, it is possible to use a pnp-type bipolar transistor and an n-channel JFET instead of the above-mentioned npn-type bipolar transistor and p-channel JFET, respectively.

We claim:

1. A semiconductor device formed in a common semiconductor substrate, the substrate having an upper, main surface, comprising: a first bipolar transistor having a first, wide emitter width and a second bipolar transistor have a second, narrow emitter width relatively to the first, wide emitter width, the first and second transistors being formed in the common semiconductor substrate and respectively having first and second, emitter, base and collector regions, at successively lower positions within the substrate and relatively to the upper, main surface of the substrate, defining corresponding base-emitter and basecollector junctions with an associated active base region between the junctions, the first and second active base regions of the first and second transistors having respective thickness dimensions in a direction transverse to the upper, main surface of the substrate, and the respective impurity concentrations int he base regions of the first and second transistor being selected so as to afford substantially equivalent, total amounts of impurities in the respective first and second active base regions and, correspondingly, balanced static emitter current gains $h_{FE}$ of the respective first and second transistors, and first an second patterned portions of a layer of impurity-doped polycrystalline silicon having ion-implanted impurities therein formed on the upper, main surface of the substrate in correspondence to the first and second emitter regions, respectively, and functioning as respective first and second impurity diffusion sources from which impurities are diffused into the substrate thereby forming and defining the respective first and second emitter regions.

2. A semiconductor device according to claim 1, wherein said first, wide emitter width is from 0.4 to 4.0 μm and said second, narrow emitter width is from 0.1 to 0.75 μm.

3. A semiconductor device according to claim 3, wherein said first, wide emitter width is from 0.45 to 1.0 μm and said second, narrow emitter width is from 0.2 to 0.4 μm.

4. A semiconductor device as recited in claim 1, wherein the respective base regions of the first and second transistors define respective first and second base-collector junctions at respective first and second positions within the substrate, the first position of the first base-collector junction of the first transistor being lower, relatively to the upper, main surface of the substrate, than the second position of the base-collector junction of the second transistor.

5. A semiconductor device as recited in claim 1, wherein the thickness dimension of the first active base region is greater than that of the second active region and the impurity concentration of the first active region is less than that of the second active region.

6. A semiconductor device as recited in claim 1, wherein the first base region is of a greater thickness dimension than that of the second base region, in a direction transverse to the upper, main surface of the substrate.

7. A semiconductor device formed in a common semiconductor substrate, the substrate having an upper, main surface, and comprising: a first bipolar transistor having a first, wide emitter width and a second bipolar transistor have a second, narrow emitter width relatively to the first, wide emitter width, the first and second transistors being formed int he common semiconductor substrate and respectively having first and second, emitter, base and collector regions, at successively lower positions within the substrate relatively to the upper, main surface of the substrate, defining corresponding base-emitter and base-collector junctions with an associated active base region between the junctions, the first base region of the first transistor and the second base region of the second transistor having respective thickness dimensions which are substantially the same, as measured in a direction transverse to the upper, main surface of the substrate, and respectively having first and second, relatively higher and lower impurity concentrations selected so as to afford substantially the same amounts of impurities int eh respective, first and second active base regions, and first and second patterned portions of a layer of impurity-doped polycrystalline silicon having ion-implanted impurities therein formed on the upper, main surface of the substrate in correspondence to the first and second emitter regions, respectively, and functioning as respective first and second impurity diffusion sources from which impurities are diffused into the substrate thereby forming and defining the respective first and second emitter regions.

8. A semiconductor device according to claim 7, wherein said first impurity concentration of said first base region corresponds to a dose of from $3 \times 10^{13}$ cm$^{-2}$ to $10 \times 10^{13}$ cm$^{-2}$, and said second impurity concentration of said second base region corresponds to a dose of from $1 \times 10^{13}$ cm$^{-2}$ to $8 \times 10^{13}$ cm$^{-2}$, the first concentration being higher than the second concentration.

9. A semiconductor device according to claim 7, wherein said first impurity concentration of said first base region corresponds to a dose of from $4 \times 10^{13}$ cm$^{-2}$ to $7 \times 10^{13}$ cm$^{-2}$, and said second impurity concentration of said second base region corresponds to a dose of from $3 \times 10^{13}$ cm$^{-2}$ to $6 \times 19^{13}$ cm$^{-2}$, the first concentration being higher than the second concentration.

10. A semiconductor device formed in a common semiconductor substrate, the substrate having an upper, main surface, comprising:

first and second junction field-effect transistors formed in the common semiconductor substrate, each having a top gate region with an exposed top surface portion at the upper, main surface of the substrate, a submerged gate region formed within the substrate and electrically connected at opposite ends thereof to corresponding conductive regions having respective, exposed top end surface portions at the main surface of the substrate, and a conductive channel region within the substrate and sandwiched between the top and submerged gate regions, wtih opposite end portions thereof having respective, exposed top end surface portions at the main surface of the substrate;

the top gate regions of the corresponding first and second junction field-effect transistors respectively having a first, wide gate width and a second, narrow gate width relatively to the first gate width; and patterned portions of a layer of impurity-doped polycrystalline silicon having ion-implanted impurities therein and formed on the upper, main surface of the substrate respectively in correspondence with and covering the exposed top surface portions of the respective top gate regions of the corresponding first and second junction field-effect transistors and functioning as respective first and second impurity diffusion sources from which impurities are diffused into the substrate and thereby form and define the respective top gate regions and further wherein the respective impurity amounts of the conductive channel regions of the corresponding first and second junction field-effect transistors are substantially the same.

11. A semiconductor device comprising a high-current bipolar transistor and a high-speed bipolar transistor formed in a common semiconductor substrate having an upper, main surface, the common semiconductor substrate comprising a semiconductor wafer substrate having an upper, main surface and an epitaxial semiconductor layer formed on the upper, main surface of the wafer substrate, comprising:

an isolation region in the epitaxial layer defining first and second portions of the epitaxial layer;

the high-current bipolar transistor comprising a collector region afforded by the first portion of the epitaxial layer, a base region formed in the collector region and having a first depth dimension in a direction transverse to the upper, main surface of the substrate, an emitter region formed in the base region and of first width and depth dimensions, respectively parallel and transverse to the upper, main surface, each of the collector, base and emitter regions having exposed, top surface portions, a first, patterned portion of a layer of impurity-doped polycrystalline silicon having ion-implanted impurities therein and formed on the upper, main surface of the substrate respectively in correspondence with and covering the exposed, top surface portion of the emitter region thereof and functioning as an impurity diffusion source from which impurities are diffused into the substrate an thereby form and define the emitter region thereof, and collector, base and emitter electrodes formed respectively on the exposed, top surface portions of the collector and base regions thereof and on the first, patterned portion of the impurity-containing layer; and the high-speed bipolar transistor comprising a collector region afforded by the second portion of the epitaxial layer, a base region formed in the collector region and having a second depth dimension in a direction transverse to the upper, main surface of the substrate which is less than the first depth dimension of the base region of the high-current transistor, an emitter region formed in the base region thereof and having second, width and depth dimensions, respectively parallel and transverse to the upper, main surface, which are smaller than the respective, first width and depth dimensions of the emitter region of the high-current bipolar transistor, each of the collector, base and emitter regions having an exposed, top surface portion, a second, patterned portion of a layer of impurity-doped polycrystalline silicon having ion-implanted impurities therein and formed on the upper, main surface of the substrate respectively in correspondence with and covering the exposed, top surface portion of the emitter region thereof and functioning as an impurity diffusion source from which impurities are diffused into the substrate and thereby form and define the emitter region thereof, the amount of impurities in the respective, active base regions of the high-current and high-speed bipolar transistors being substantially the same, and collector, base and emitter electrodes formed respectively on the exposed, top surface portions of the collector and base regions thereof and on the second portion of the impurity-containing layer.

12. A semiconductor device comprising a high-current bipolar transistor and a high-speed bipolar transistor formed in a common semiconductor substrate having an upper, main surface, the common semiconductor substrate comprising a semiconductor wafer substrate having an upper, main surface and an epitaxial semiconductor layer formed on the upper, main surface of the wafer substrate, comprising:

an isolation region in the epitaxial layer defining first and second portions of the epitaxial layer;

the high-current bipolar transistor comprising a collector region afforded by the first portion of the epitaxial layer, a base region formed in the collector region and having a first depth dimension in a direction transverse to the upper, main surface of the substrate, an emitter region formed in the base region and of first width and depth dimensions, respectively parallel and transverse to the upper, main surface, each of the collector, base and emitter regions having exposed, top surface portions, a first, patterned portion of a layer of impurity-doped polycrystalline silicon having ion-implanted impurities therein and formed on the upper, main surface of the substrate in correspondence with and covering the exposed top surface portion of the emitter region thereof and functioning as an impurity diffusion source from which impurities are diffused into the substrate and thereby form and define the emitter region thereof, and collector, base and emitter electrodes formed respectively on the exposed top surface portions of the collector and base regions thereof and on the first, patterned portion of the impurity-containing layer; and the high-speed bipolar transistor comprising a collector region afforded by the second portion of the epitaxial layer, a base region formed in the collector region and having a second depth dimension in a direction transverse to the upper, main surface of the substrate which is the same as the first depth dimension of the base region of the high-current transistor, an emitter region formed in the base region thereof and having second, width and depth dimensions, respectively parallel and transverse to the upper, main surface, which are less than the respective, first width and depth dimension of the base region of the high-current bipolar transistor, a second patterned portion of a layer of impurity-doped polycrystalline silicon having ion-implanted impurities therein and formed on the upper, main surface of the substrate respectively in correspondence with and covering the exposed, top surface portion of the emitter region thereof and functioning as an impurity diffusion source from which impurities are diffused into the substrate and thereby form and define the emitter region thereof and wherein the amount of impurities int eh respective, active base regions of the high-current and high-speed bipolar transistors are substantially the same, and collector, base and emitter electrodes formed respectively on the exposed, top surface portions of the collector and base regions thereof and on the second portion of the impurity-containing layer.

* * * * *

UNITED STATES PATENT AND TRADEMARK OFFICE
CERTIFICATE OF CORRECTION

PATENT NO. : 5,151,765
DATED : September 29, 1992
INVENTOR(S) : Tunenori YAMAUCHI It is certified that error appears in the above-indentified patent and that said Letters Patent is hereby corrected as shown below:

TITLE PAGE: [57] ABSTRACT:
    line 2, after "first" insert --,--;
    line 3, after "first" insert --,--;
    line 4, after "second" insert --,-- and before "narrow" insert --second,--;
    line 6, delete "second";
    line 9, change "$h_{F_e}$" to --$h_{FE}$--;
    line 10, delete "and".

TITLE PAGE: [56] References Cited: OTHER PUBLICATIONS:
    line 6, change "Prospe" to --Prospects--.

Col. 1,   line 14, change "and" to --or--;
          line 46, change "Prospe" to --Prospects--.

Col. 2,   line 30, change "the" (third occurrence) to --an--;
          line 40, after "have" insert --different submicron widths, while maintaining a suitable--.

Col. 3,   line 55, change "sectional" to --cross-sectional--;
          line 59, change "sectional" to --cross-sectional--.

Col. 4,   line 45, change "8bthe" to --8b the--.

Col. 5,   line 41, change "4b" to --14b--.

Col. 6,   line 5, change "B" to --B'--;
          line 10, start a new paragraph at "For example";
          line 27, delete ",";
          line 36, change "b'" to --B'--;
          line 38, change "is" to --in--;
          line 55, change "npn-type" to --$n^+$-type--.

UNITED STATES PATENT AND TRADEMARK OFFICE
CERTIFICATE OF CORRECTION

PATENT NO. : 5,151,765
DATED : September 29, 1992
INVENTOR(S) : Tunenori YAMAUCHI It is certified that error appears in the above-indentified patent and that said Letters Patent is hereby corrected as shown below:

Col. 7, line 22, change "10, only" to --10 only,--;
line 62, change "sorce" to --source--;
line 67, after "respective" insert --,--.

Col. 9, line 1, change "basecollector" to --base-collector--;
line 7, change "int he" to --in the--;
line 12, change "an" to --and--;
line 26, change "claim 3" to --claim 2--.

Col. 10, line 19, change "claim 7" to --claim 8--;
line 24, change "$6 \times 19^{13} cm^{-2}$" to --$6 \times 10^{13} cm^{-2}$--;
line 41, change "wtih" to --with--.

Col. 12, line 54, change "int he" to --in the--.

Signed and Sealed this

Seventeenth Day of May, 1994

Attest:

BRUCE LEHMAN

Attesting Officer   Commissioner of Patents and Trademarks